United States Patent [19]
Zushi

[11] Patent Number: 5,051,706
[45] Date of Patent: Sep. 24, 1991

[54] HIGH FREQUENCY POWER AMPLIFIER CIRCUIT

[75] Inventor: Takaji Zushi, Yokosuka, Japan

[73] Assignee: Kabushiki Kaisha Toshiba, Kawasaki, Japan

[21] Appl. No.: 433,914

[22] Filed: Nov. 9, 1989

[30] Foreign Application Priority Data

Nov. 9, 1988 [JP] Japan ............................. 63-283184

[51] Int. Cl.[5] ......................................... H03F 3/191
[52] U.S. Cl. .................................. 330/277; 330/306
[58] Field of Search ............... 330/185, 192, 277, 302, 330/306

[56] References Cited

U.S. PATENT DOCUMENTS 3,860,881  1/1975  Etherington et al. .............. 330/302
4,774,477  9/1988  Rodes et al. ....................... 330/277

FOREIGN PATENT DOCUMENTS 2532670  2/1976  Fed. Rep. of Germany ...... 330/302
1535201  12/1978  United Kingdom .

Primary Examiner—James B. Mullins
Attorney, Agent, or Firm—Oblon, Spivak, McClelland, Maier & Neustadt

[57] ABSTRACT

A first high inductor is connected between a ground point and the base of a high frequency amplifying transistor whose emitter is grounded. A first capacitor is connected between a mid-point of the first inductor and the ground point. A second inductor is connected between the collector of the transistor and a power source terminal. A second capacitor is connected between a mid-point of the second inductor and the ground point. The first inductor connects the base of the transistor to ground in a DC mode, and cooperates with the first capacitor to form a first series resonant circuit. The resonance frequency of the circuit is equal to half of the frequency "f" of an input signal to the transistor. The resonant first series circuit allows a signal of the f/2 frequency generated on the base side of the transistor to flow to the ground point. The second inductor feeds electric power to the collector of the transistor, and cooperates with the second capacitor to form a second series resonant circuit. The resonance second series resonant frequency of the circuit is equal to half of the frequency "f" of an input signal to the transistor. The second series resonant circuit allows a signal of the f/2 frequency generated on the collector side of the transistor to flow to the ground point.

9 Claims, 5 Drawing Sheets

HIGH FREQUENCY POWER AMPLIFIER CIRCUIT

BACKGROUND OF THE INVENTION

1. Field of the Invention

The present invention relates to a high frequency power amplifier circuit used in a transmitting stage of a radio communication apparatus.

2. Description of the Related Art

A transmitting stage of a wireless or radio communication apparatus may be enumerated for a typical application of the high frequency power amplifier circuit. The frequencies of the radio waves that are radiated from the output stage of the power amplifier circuit must be within those permitted by the regulations.

An example of the arrangement of one of the conventional high frequency power amplifier circuits will be referred to in brief. A signal is generated by a signal source, and enters an input terminal of the power amplifier circuit. The signal is applied to the base of a high frequency amplifying transistor of the npn type, by way of a first capacitor and a first impedance matching circuit. The emitter of the transistor is connected to a ground point. A first inductor for applying voltage to the collector of transistor is inserted between the collector of the transistor and the power source terminal. A collector potential of the transistor is outputted from an output terminal of the amplifier circuit via a second impedance matching circuit and a second capacitor. A second inductor for grounding the base of the transistor in a DC mode is inserted between the base of the transistor and the ground point. A first series resonant circuit containing an inductor and a capacitor that are connected in series, is placed between the base of the transistor and the ground point. A second series resonant circuit containing an inductor and a capacitor that are connected in series, is placed between the collector of the transistor and the ground point. A third capacitor for removing high frequency components is placed between the ground point and the power source terminal coupled with a first end of the first inductor.

It has been known that of the abnormal oscillating frequencies of the high frequency power amplifier circuit, the highest frequency against the frequency "f" of the input signal is half of the frequency "f". The oscillation at such a frequency is called an "f/2 oscillation (parametric oscillation)". The f/2 oscillation occurs under the condition that the real part of the input impedance to the amplifying element consisting of the transistor, for example, is negative at the f/2 frequency. To set up this condition, a series resonant circuit is coupled to the input circuit or the output circuit of the amplifying element.

In the conventional high frequency power amplifier circuit as mentioned above, the first impedance matching circuit and the second inductor, and the second impedance matching circuit and the first inductor make up respectively series resonant circuits. Provision of the first and second series resonant circuits in the base side and the collector side of the transistor provides a path through which an f/2 oscillation signal flows to the ground point, thereby to prevent the signals due to the abnormal oscillation other than predetermined frequencies being derived from the output terminal.

In the high frequency power amplifier circuit thus arranged, the series resonant circuit is connected between the base and the collector of the transistor as the amplifying element. In other words, it is directly coupled with the main part of the amplifier circuit. With this connection, the total number of the inductors directly inserted between the main circuit and the ground point are four; the first and second inductors, and the two inductors contained in the first and second series resonant circuits. The circuit inductance is increased, and the series resonant circuits become sensitive to input signals of the frequencies lower than the ½ frequency. Therefore, those circuits tend to oscillate in response to such input signals, viz., to cause the parasitic oscillation. Accordingly, the high frequency amplifier circuit is instable in operation.

Thus, the high frequency power amplifier circuit is provided with the series resonant circuits, which are provided in the main part of the amplifier circuit, in order to prevent the f/2 oscillation. Because of using the series resonant circuits, the amplifier circuit is instable against the input signal of the frequency below the f/2 frequency.

SUMMARY OF THE INVENTION

Accordingly, an object of the present invention is to provide a high frequency power amplifier circuit which is stable against a broad frequencies of the input signal applied thereto.

To achieve the above object, there is provided a high frequency power amplifier circuit comprising: a high frequency amplifying transistor whose emitter is connected to a ground point; a first inductive element connected between a base of the high frequency amplifying transistor and the ground point; a second inductive element connected between a collector of the high frequency amplifying transistor and a power source; and a capacitive element provided between a mid-point of the first inductive element and the ground point and/or between a mid-point of the second inductive element and the ground point, the capacitive element cooperating with the first inductive element and/or the second inductive element, to form a series resonant circuit whose resonance frequency is ½ of the frequency of an input signal to the high frequency amplifying transistor.

The capacitive element is provided between a ground point and a mid-point of the first inductive element connected between the base of the high frequency amplifying transistor and the ground point and/or the second inductive element connected between the collector of the high frequency amplifying transistor and a power source. This connection provides a series resonant circuit whose resonance frequency is ½ of the frequency of an input signal to the high frequency amplifying transistor. An equivalent circuit of the amplifier circuit containing the series resonant circuit, when the amplifier circuit receives an input signal of an intended frequency, is substantially the same as that of the amplifier circuit not containing the series resonant circuit. This fact indicates that the main part of the amplifier circuit contains a decreased inductance. Accordingly, the series resonant circuit is insensitive to the input signals of lower frequencies than the f/2 frequency, and the parasitic oscillation is hard to occur.

Consequently, the high frequency power amplifier circuit according to the present invention, that is thus arranged, is stably operable over broad frequencies of the input signal.

DETAILED DESCRIPTION OF THE PREFERRED EMBODIMENTS

Figure 1:
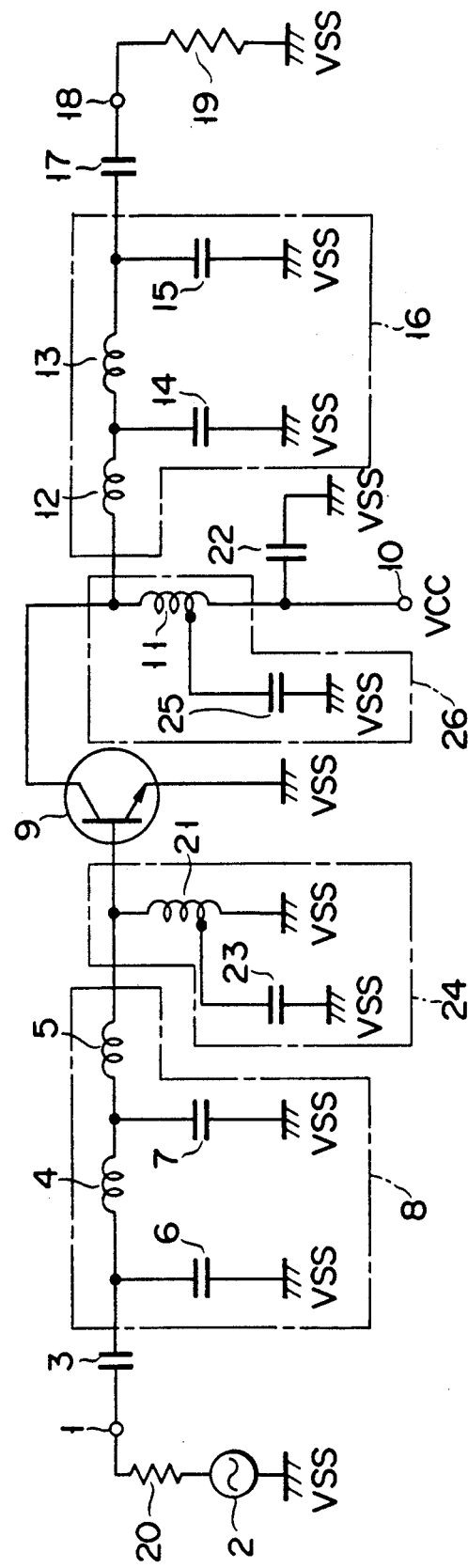
FIG. 1 is a circuit diagram of a high frequency power amplifier circuit according to an embodiment of the present invention.

Reference is made to FIG. 1 showing a circuit diagram of a high frequency power amplifier circuit according to a first embodiment of the present invention. In the instant embodiment, the high frequency power amplifier circuit is designed to be used for the transmitting stage of a radio communication apparatus. A signal generated by a signal source 2 is applied to an input terminal 1 of the high frequency power amplifier circuit, through a resistor 20 (load impedance). A capacitor 3 is inserted between the input terminal 1 and an inductor 4. An interconnection point between the capacitor 3 and the inductor 4 is connected through another capacitor 6 to a ground point Vss. The inductor 4 is further connected to another inductor 5, and an interconnection point of these inductors is connected through a further capacitor 7 to the ground point Vss. The inductors 4 and 5, and the capacitors 6 and 7 make up an impedance matching circuit 8. The inductor 5 is further connected to the base of an npn transistor 9, and an interconnecting point of the inductor 5 and the base of the transistor 9 is connected through an inductor 21 to the ground point Vss. The path containing the inductor 21 provides a shortcircuit path for the DC between the base of the transistor 9 and the ground point Vss. A capacitor 23 is inserted between a mid-point of the inductor 21 and the ground point Vss. The inductor 21 and the capacitor 23 make up a series resonant circuit 24 for leading a signal that is generated at the base of the transistor 9 due to the f/2 oscillation, to the ground point Vss.

The emitter of the transistor 9 is coupled with the ground point Vss. An inductor 11 for applying voltage to the collector of transistor 9 is inserted between the collector of the transistor 9 and a power source terminal 10 coupled with a power source voltage Vcc. A capacitor 25 is connected between a mid-point of the inductor 11 and the ground point Vss. The inductor 11 and the capacitor 25 form a series resonant circuit 26 which provides a path through which an f/2 oscillation signal generated at the collector of the transistor 9 flows to the ground point Vss. A capacitor 22 for removing the high frequency components is connected between the power source terminal 10 and the ground point Vss. The collector of the transistor 9 is connected to a first end of an inductor 12. A second end of the inductor 12 is connected to a first end of an inductor 13. A capacitor 14 is located between the second end of the inductor 12 and the ground point Vss. A second end of the inductor 13 is connected to a first electrode of a capacitor 17. A second electrode of the capacitor 17 is connected to a output terminal 18. A capacitor 15 is connected between the second end of the inductor 13 and the ground point Vss. The inductors 12 and 13, and the capacitors 14 and 15 make up an impedance matching circuit 16. A resistor (load impedance) 19 is connected between the output terminal 18 and the ground point Vss.

The high frequency power amplifier circuit illustrated in FIG. 1 is capable of outputting a power of 15W or more, under the condition that the frequency of an input signal is 135 to 175 MHz, an input power is 2W, and a power source voltage Vcc is 10 to 12.5 V. For the power amplifier circuit as the output stage, such a stability is required that it will never oscillate under the condition that the input power is within 0 to 4W, the power source voltage Vcc is within 10 to 16.5 V, and 80% of the output power is fed back to the output stage, from the load.

To secure the amplifying operation of the transistor 9, the impedance between the base of the transistor and the ground point Vss is approximately 1 $\Omega$, and the impedance between the collector and the ground point is approximately 5 $\Omega$. The load impedance 20 connected to the input terminal 1 and the load impedance 19 connected to the output terminal 18 are each approximately 50 $\Omega$. It is for matching the input impedance of the output stage with the output impedance that the impedance matching circuits 8 and 16 are provided.

A signal generated by the signal source 2 is applied through the load impedance 20 to the input terminal 1. The input signal applied to the input terminal 1 enters the impedance matching circuit 8 through a capacitive coupling by the capacitor 3. The signal passed through the impedance matching circuit 8 reaches the base of the transistor 9. The transistor 9 amplifies the signal. The amplified signal passes through another impedance matching circuit 16, and reaches the capacitor 17. The signal is capacitively coupled with the output terminal 18 by means of the capacitor 17. Finally, it appears across the load impedance 19. An f/2 oscillation signal generated on the base side of the transistor 9 is led to the ground point Vss by means of the series resonant circuit 24. An f/2 oscillation signal generated on the collector side of the transistor 9 is led to the ground point Vss by means of the series resonant circuit 26.

As recalled, in the instant embodiment, the path leading the f/2 oscillation signal on the base side of the transistor 9 to the ground point Vss is provided by the series resonant circuit 24 that is formed by the inductor 21 and the capacitor 23. The inductor 21 is for grounding the base of the transistor 9 in a DC mode. The capacitor 23 is connected between the mid-point of the inductor 21 and the ground point Vss. The path leading the f/2 oscillation signal on the collector side of the transistor 9 to the ground point Vss is provided by the series resonant circuit 26 that is formed by the inductor 11 and the capacitor 25. The inductor 11 is for applying voltage to the collector of the transistor 9. The capacitor 25 is connected between the mid-point of the inductor 11 and the ground point Vss. The inductance of each inductor 21 and 11 is set to be a value several times the input and output impedance of the transistor 9, in order to suppress the oscillation at low frequencies. Allowing for the inductance of those inductors, the capacitance of each capacitor 23 and 25 is selected to be such a value that the resonance frequency of each of the series resonant circuits 24 and 26 is equal to the f/2 frequency.

Figure 2:
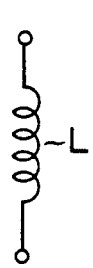
FIGS. 2 and 3 show diagrams useful in explaining parameters in a series resonant circuit used in the circuit of FIG. 1.
Figure 3:
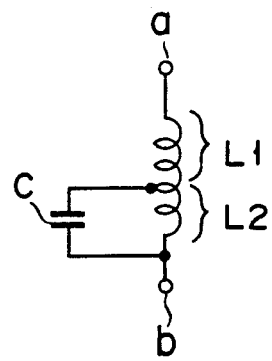
Figure 4:
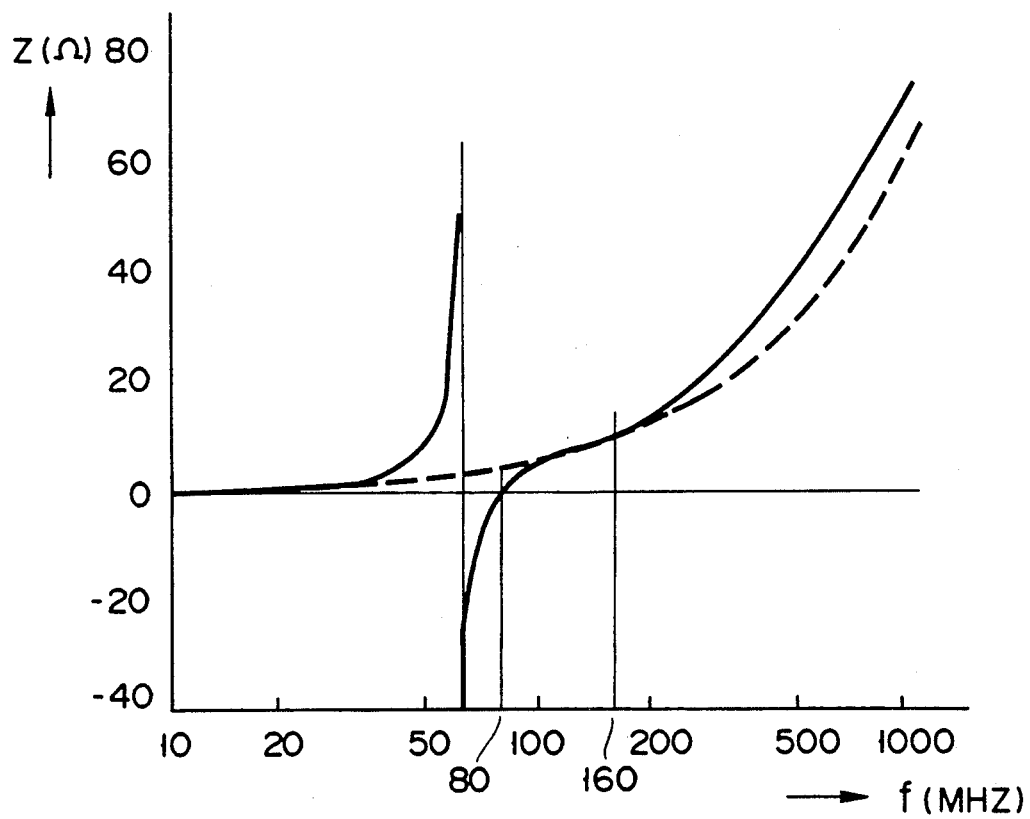
FIG. 4 shows a graphical representation of a frequency—impedance characteristic of the inductor of FIG. 2.

Let us consider a single inductor L shown in FIG. 2 as the low frequency oscillation suppressing inductor such as the inductors 21 and 11. The inductor must have inductance of approximately 10nH so that it exhibits an impedance characteristic curve including a point of j10 Ω at 160 MHz, as shown in FIG. 4. Values of inductors L1 and L2, and a capacitor C in the series resonant circuit (see FIG. 3) are selected so that the inductor exhibits 0 Ω at 80 MHz, half of the frequency 160 MHz, without damaging the impedance—frequency characteristic. Specific examples of those parameters L1, L2 and C will be given below.

It is assumed now that "f" indicates the frequency of an input signal, and $\omega = 2\pi f$. Let Z(f) be an impedance between the terminals "a" and "b" in FIG. 3.

$$Z(f) = j\omega L1 + \frac{1}{j\omega C + \frac{1}{j\omega L2}} \quad (1)$$

$$= \frac{j\omega(L1 + L2 - \omega^2 L1\, L2\, C)}{1 - \omega^2 L2\, C}$$

When Z(f)=0, the equation (1) can be rearranged into $$\omega^2 L1\, L2\, C = L1 + L2 \quad (2)$$

$$f = \frac{1}{2\pi} \sqrt{\frac{1}{L1\, C}\left(1 + \frac{1}{L2/L1}\right)}$$

As recalled, Z(f)=j10 Ω at 160 MHz, and Z(f)=0 Ω at 80 MHz. To satisfy this condition, the values of the parameters L1, L2 and C, are selected in the following manner.

From Z(160 MHz)=$j\omega L1$=j10, L1=10 to 12 nH.
If L2/L1=0.2 to 0.5, L2=2 to 6nH.
From the values of L2 and L1, and the equation (2), we have C=1000 to 2000 pF.
Further, from the values L1, L2 and C, and the equations (1) and (2), we have L1=11.1 nH, L2=3.6 nH, and C=1500 pF.

The values of the parameters L1, L2 and C of the series resonant circuits 24 and 26 shown in FIG. 1 are selected in the above-mentioned manner. An equivalent circuit of the amplifier circuit of FIG. 1 containing the series resonant circuits, when the amplifier circuit receives an input signal of an intended frequency, is substantially the same as that of the amplifier circuit not containing the series resonant circuit. The inductor 11 for applying voltage and the inductor for grounding the base of the amplifying element or transistor 9 are also used as the inductive elements of the series resonant circuits. Therefore, the main part of the amplifier circuit contains a decreased inductance. This indicates that the series resonant circuits are insensitive to the amplifying signals of lower frequencies than the f/2 frequency, and the parasitic oscillation is hard to occur. Consequently, the high frequency power amplifier circuit according to the present invention, that is thus arranged, is stably operable over broad frequencies of the input signal. The f/2 oscillation tends to occur in the lower frequencies of the amplified signal. To cope with this, the amplifier circuit of this instance may be designed such that the frequency region within which the amplifier circuit is stably operable is broadened up to the lower frequencies. If so designed, the amplifier circuit is stably operable over a broad frequency range. The amplifier circuit is advantageously featured in that the number of inductors can be decreased by two when comparing with that of the conventional amplifier circuit. This fact implies simplification and size reduction of the circuit arrangement.

An example of an amplifier circuit that was actually designed and assembled according to the present invention is now described below. The conditions under which the amplifier circuit was operated, were: the frequency of an input signal is between 135 and 175 MHz, an input power, between 0 and 4W, and the voltage of a power source, between 10 and 16.6 V, and in those ranges, a load is conditioned such that 80% of the output power is fed back to the transmitting stage. The inventor of the present invention confirmed that the circuit shown in FIG. 1 did not oscillate when it was actually operated under the above conditions.

A second embodiment of an amplifier circuit according to the present invention will now be described with reference to FIG. 5.

Figure 5:
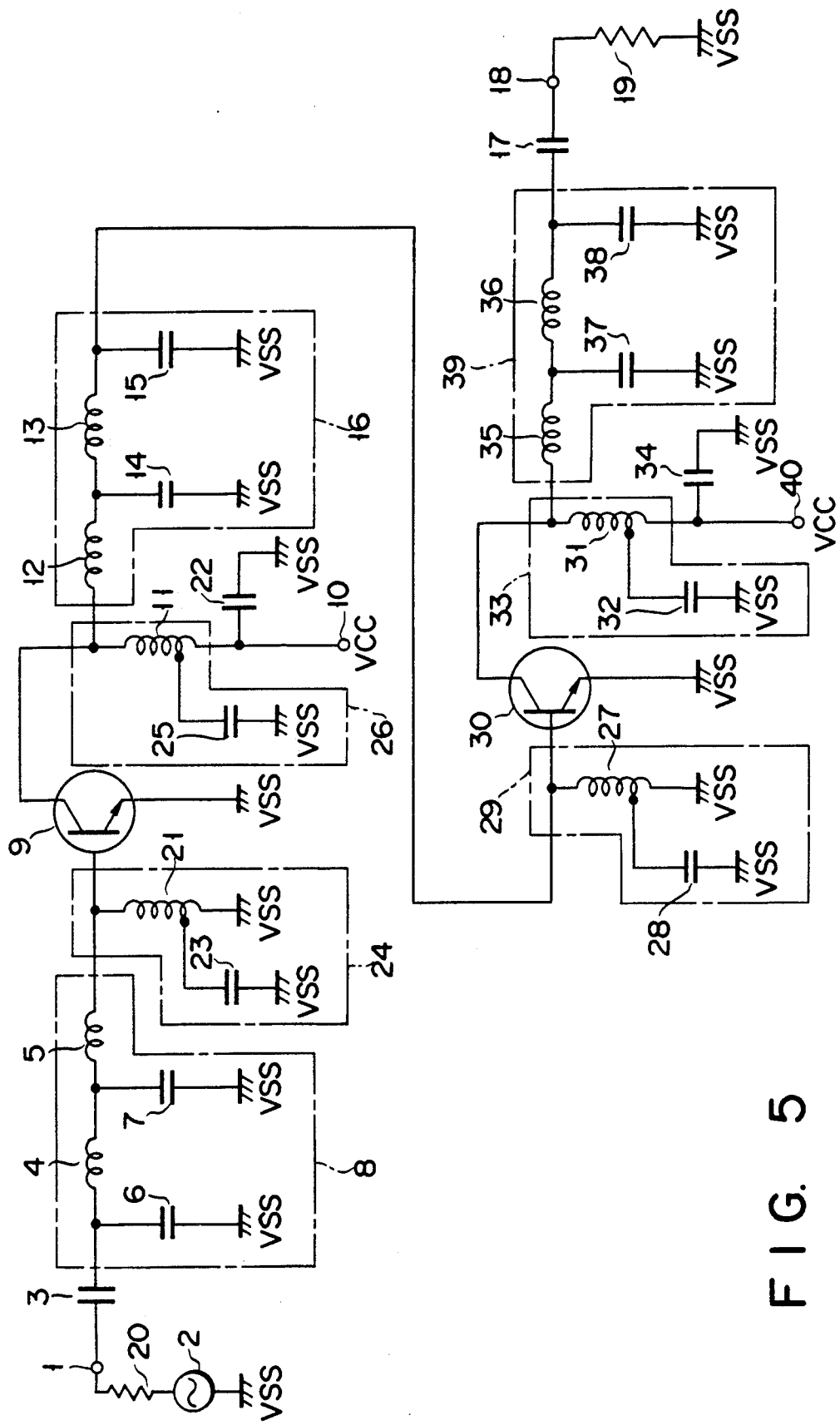
FIGS. 5 to 7 are circuit diagrams of high frequency power amplifier circuits according to other embodiments of the present invention.

As seen from this figure, the amplifier circuit of FIG. 5 corresponds to a couple of the amplifier circuits of FIG. 1 that are coupled in series. As shown, in the amplifier circuit of FIG. 5, a series resonant circuit 29, an npn transistor 30 for high frequency amplification, a series resonant circuit 33, a capacitor 34 for high frequency components removal, and an impedance matching circuit 39 are inserted between the impedance matching circuit 16 and a capacitor 17. The series resonant circuit 29 is made up of an inductor 27 and a capacitor 28. The series resonant circuit 33 is made up of an inductor 31 and a capacitor 32. The impedance matching circuit 39 is constructed with inductors 35 and 36, and capacitors 37 and 38. The base of the transistor 30 is connected to the node of the inductor 13 and the capacitor 15 in the impedance matching circuit 16 of the first stage of the amplifier circuit, and further to the first end of the inductor 27 in the series resonant circuit 29 of the second stage of the amplifier circuit. The second end of the inductor and the emitter of the transistor 30 are grounded. In the series resonant circuit 29, the capacitor 28 is connected between the mid-point of the inductor 27 and the ground point Vss. An inductor 31 is inserted between the collector of the transistor 30 and a power source terminal 40 coupled for reception with a power source voltage Vcc. A capacitor 32 is connected between the mid-point of the inductor 31 and the ground point Vss. The collector of the transistor 30 is connected to the first end of the inductor 35 in the impedance matching circuit 39. In the impedance matching circuit 39, the capacitor 37 is connected between the connection node of the inductors 35 and 36, and the ground point Vss. The capacitor 38 is connected between one end of the inductor 36 and the ground point Vss. The connection node between the inductor 36 and the capacitor 38 is connected to the first electrode of the capacitor 17.

The amplifier circuit thus arranged is advantageous in that an increased amplification is obtained, and it is easy to control the circuit characteristics. The latter feature of the instant embodiment is useful particularly when it is applied to wireless communication equipment, because for such equipment, the output level and the frequency are frequently under control of regulations, and those items are controllable when the amplifier circuit is used for the output stage of the communication equipment.

In the first and second embodiments of the amplifier circuit, the high frequency amplifying transistors each consist of an npn bipolar transistor. This type of transistor may be replaced by a field effect transistor (FET), if required. In this case, the source of the FET replaces the emitter of the bipolar transistor; the gate replaces the base; the drain replaces the collector. The FET has a normally-on characteristic that a large current flow through the drain - source path continues unless a negative voltage is applied to the gate. Therefore, where the FET is used, application of the gate bias voltage is required. To this end, a resistor is connected between the gate of the FET and a gate bias terminal, and another resistor is connected between the gate of the FET and the ground point. A capacitor is connected between the gate bias terminal and the ground point Vss. In an impedance matching circuit 8' of the instant embodiment of FIG. 6, which corresponds to the impedance matching circuit 8 in FIG. 1, the capacitor 6 is not used.

To be more specific, a signal derived from a signal source 2 is applied to a resistor (load impedance) 20 to an input terminal 1. The input terminal 1 is connected to a first electrode of a capacitor 3 whose second electrode is connected to first end of an inductor 4 of the impedance matching circuit 8'a. In the circuit 8', second end of the inductor 4 is connected to a first end of an inductor 5, and the connection node of them is connected through a capacitor 7 to the ground point Vss. A second end of the inductor 5 is connected to the gate of the FET or transistor 41. A resistor 42 is connected between the gate of the transistor 41 and the ground point Vss. Another resistor 44 is connected between the gate of the transistor 41 and a gate bias terminal 43. A capacitor 23 is connected between the gate bias terminal 43 and the ground point Vss. The resistors 42 and 44 divide a bias voltage VB and applies the divided voltage as a gate bias voltage to the gate of the transistor 41. The resistor 44 and the capacitor 23 make up a filter circuit 24' to allow only the f/2 signal generated on the gate side of the transistor 41 to pass to the ground point Vss. The circuit 24' corresponds to the series resonant circuit 24 in FIG. 1. In the amplifier circuit of, FIG. 6, the circuit arrangement following the collector of the transistor 41 is the same as that of FIG. 1, except that a power source voltage VDD is applied to a power source terminal 10. Hence, no further description will be given, with the same reference symbols applied to the same or equivalent portions.

Figure 6:
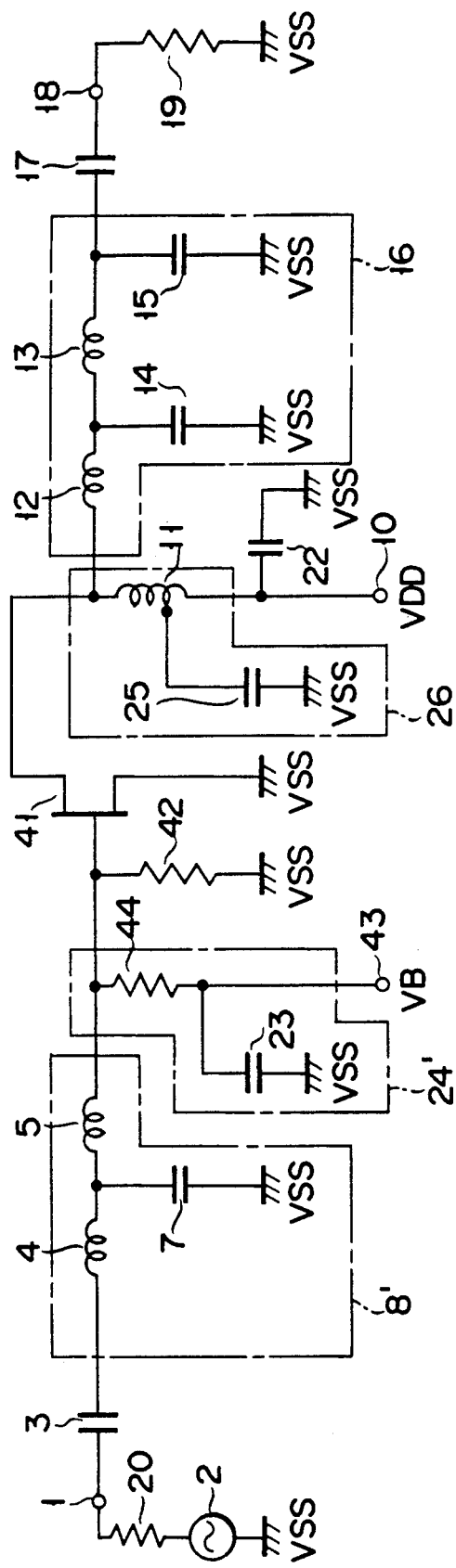
Figure 7:
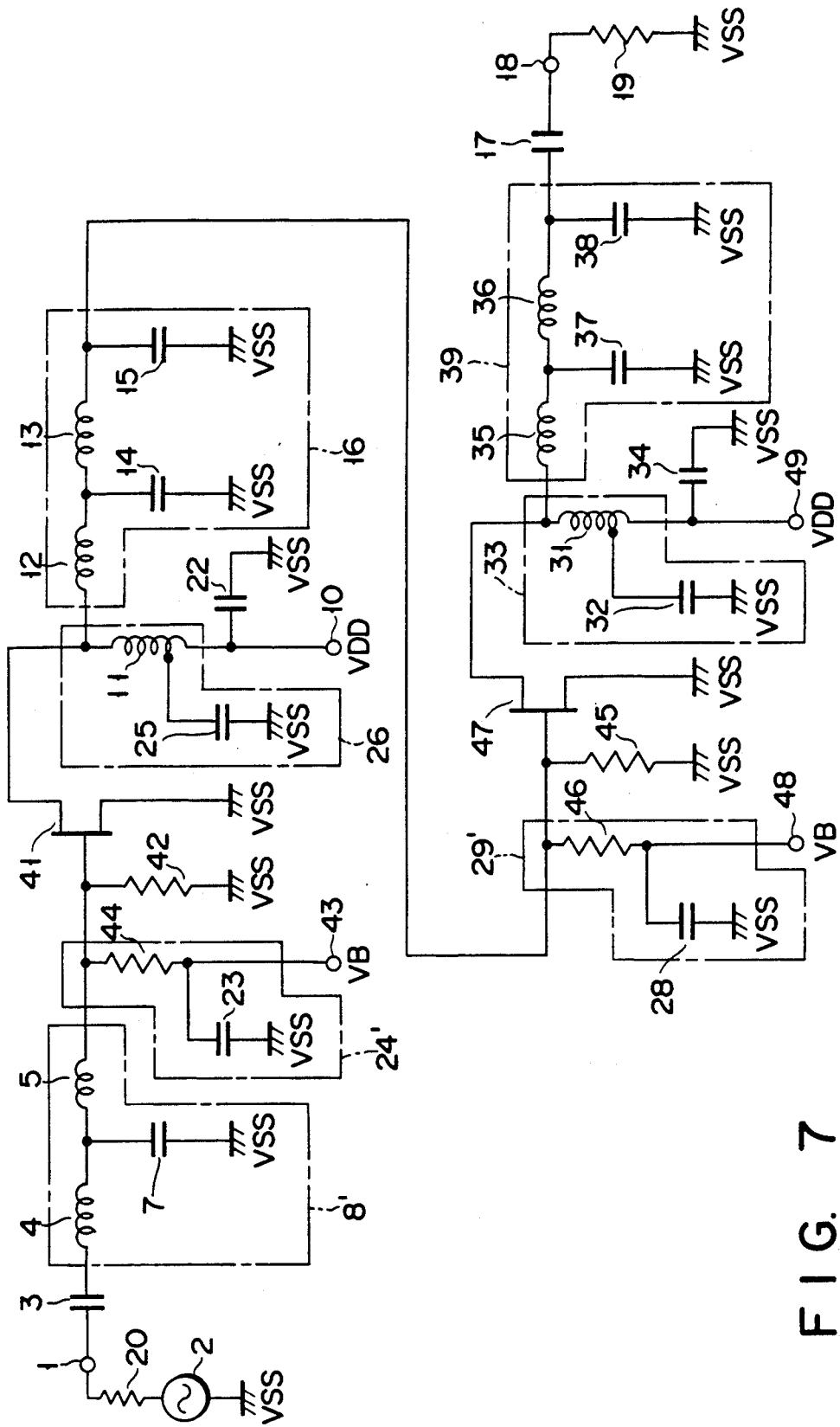

The amplifier circuit shown in FIG. 7 is constructed with two stages of amplifier circuits shown in FIG. 6 which are coupled in series or a cascaded fashion. In the description of the FIG. 7 amplifier circuit, the second stage amplifier circuit will mainly be explained, with the same reference symbols applied to the same or equivalent portions in the first stage amplifier circuit. As shown, in the FIG. 7 circuit, a filter circuit 29', a gate bias resistor 45, an FET 47 for high frequency signal amplifying, a series resonant circuit 33, a capacitor 34 for removing high frequency components, and an impedance matching circuit 39 are inserted between the impedance matching circuit 16 in the first stage amplifier circuit, and a capacitor 17. The filter circuit 29' is made up of a resistor 46 and a capacitor 28. The series resonant circuit 33 is made up of an inductor 31 and a capacitor 32. The impedance matching circuit 39 includes inductors 35 and 36, and capacitors 37 and 38. In the second stage amplifier circuit, the filter circuit 29' corresponds to the circuit 24'; the transistor 47, the circuit 33, the capacitor 34, and the circuit 39 respectively correspond to those 41, 26, 22 and 16. A bias voltage VB is applied to a gate bias terminal 48, and a power source voltage VDD, to a power source terminal 49.

The basic operation of the amplifier circuits shown in FIGS. 6 and 7 is the same as that of the amplifier circuits of FIGS. 1 and 5. The advantageous effects of the FIGS. 6 and 7 circuits are comparable with those of the FIGS. 1 and 5 circuits.

It is evident to those skilled persons in the art that the present invention is not limited to the specific embodiments as mentioned above, but also may variously be modified and changed within the scope of the present invention.

In the above-mentioned embodiments, the filter circuits (24, 26, 28, 33, 24', and 29') for the f/2 frequency signal are provided on both input and output sides of each amplifying element (9, 30, 41 and 47). If required, however, the filter circuit may be provided on either the input or the output side of the amplifying element.

As seen from the foregoing description, the high frequency power amplifier circuit according to the present invention is improved in that it is stably operable over a broad range of frequencies, and in its fabrication, a less chip area is required.

What is claimed is:

1. A high frequency power amplifying apparatus comprising:
   a first capacitor whose first electrode is connected to an input node;
   a first impedance matching circuit whose input node is connected to a second electrode of said first capacitor;
   a second capacitor whose first electrode is connected to an output terminal;
   at least two power amplifying circuits connected in series between an output node of said first impedance matching circuit and a second electrode of said second capacitor, wherein each of said power amplifying circuits comprises:
   a high frequency amplifying transistor whose emitter is coupled with a first potential source,
   a first inductor connected between a base of said high frequency amplifying transistor and the first potential source,
   a second inductor connected between a collector of said high frequency amplifying transistor and a second potential source;
   a third capacitor connected between the first potential source and a mid-point of at least one of said first inductor and said second inductor, said third capacitor cooperating with either one of said first inductor and said second inductor, to form a series resonant circuit whose resonance frequency is ½ of the frequency of an input signal to said high frequency amplifying transistor; and
   a second impedance matching circuit whose input node is connected to the collector of said high frequency amplifying transistor;
   wherein an output node of the first power amplifying circuit is connected to an input node of the second power amplifying circuit.

2. The high frequency power amplifying apparatus according to claim 1, further comprising a fourth capacitor for removing high frequency components between said first and second potential sources.

3. The high frequency power amplifying apparatus according to claim 1, in which the frequency "f" of said input signal is given by the following expression $$f = \frac{1}{2\pi} \sqrt{\frac{1}{L1\,C}\left(1 + \frac{1}{L2/L1}\right)}$$

where
- L1: inductance between a first end and the mid point of said first or second inductor,
- L2: inductance between a second end and the mid point of said first or second inductor, and
- C: capacitance of said second capacitor.

4. The high frequency power amplifying apparatus according to claim 1, in which said first impedance matching circuit includes a third inductor connected at a first end to the second electrode of said first capacitor, a fourth capacitor connected between the first end of said third inductor and the first potential source, a fourth inductor connected at a first end to a second end of said third inductor and at a second end to the base of said high frequency amplifying transistor, and a fifth capacitor between the first end of said fourth inductor and the first potential source, and said second impedance matching circuit includes a fifth inductor connected at a first end to the collector of said high frequency amplifying transistor, a sixth inductor connected at a first end to a second end of said fifth inductor and at a second end to the second electrode of said second capacitor, a sixth capacitor connected between the second end of said fifth inductor and the first potential source, and a seventh capacitor connected between the second end of said sixth inductor and the first potential source.

5. A high frequency power amplifier apparatus comprising:
- a first capacitor whose first electrode is connected to an input node;
- a first impedance matching circuit whose input node is connected to a second electrode of said first capacitor;
- a second capacitor whose first electrode is connected to an output node;
- at least to power amplifying circuits connected in series between an output node f said first impedance matching circuit and a second electrode of said second capacitor, wherein each of said power amplifying circuits comprises:
- a high frequency amplifying transistor connected at a source to a first potential source;
- a first load element connected between a gate of said high frequency amplifying transistor and the first potential source;
- a second load element connected between the gate of said high frequency amplifying transistor and a gate bias terminal;
- a first inductor connected between a drain of said high frequency amplifying transistor and a second potential source;
- a third capacitor connected between said gate bias terminal and said first potential source;
- a fourth capacitor connected between said first potential source and a mid-point of said first inductor, and constituting a series resonance circuit together with said first inductor, said series resonance circuit having a ½ resonance frequency with respect to the frequency of a signal input into said high frequency amplifying transistor; and
- a second impedance matching circuit whose input node is connected to the drain of said high frequency amplifying transistor;
- wherein the output node of the first power amplifying circuit is connected to the input node of the second power amplifying circuit.

6. The high frequency power amplifying apparatus according to claim 5, further comprising a capacitor for removing high frequency components between the first and second potential sources.

7. The high frequency power amplifying apparatus according to claim 5, in which said first and second load elements include resistors.

8. The high frequency power amplifying apparatus according to claim 5, in which the frequency "f" of said input signal is given by the following expression $$f = \frac{1}{2\pi} \sqrt{\frac{1}{L1\,C}\left(1 + \frac{1}{L2/L1}\right)}$$

where
- L1: inductance between a first end and the mid point of said first inductor,
- L2: inductance between a second end and the mid point of said first inductor, and
- C: capacitance of said second capacitor.

9. The high frequency power amplifying apparatus according to claim 5, in which said first impedance matching circuit includes a second inductor connected at a first end to the second and of said first capacitor, a third inductor connected at a first end to a second end of said second inductor and at a second end to the gate of said high frequency amplifying transistor, a fourth capacitor connected between the first end of said third inductor and the first potential source, and said second impedance matching circuit includes a fourth inductor connected at a first end to the drain of said high frequency amplifying transistor, a fifth inductor connected at a first end to a second end of said fourth inductor and at a second end to the second electrode of said third capacitor, a fifth capacitor connected between the second end of said fourth inductor and the first potential source, and a sixth capacitor connected between a second end of said fifth inductor and the first potential source.

* * * * *